US006833764B1

(12) United States Patent
Dean

(10) Patent No.: US 6,833,764 B1
(45) Date of Patent: Dec. 21, 2004

(54) APPARATUS AND METHOD FOR SYNTHESIZING A FREQUENCY USING VERNIER DIVIDERS

(75) Inventor: Gregory L. Dean, Standish, ME (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 11 days.

(21) Appl. No.: 10/320,851

(22) Filed: Dec. 16, 2002

(51) Int. Cl.$^7$ ................................................. H03L 7/00
(52) U.S. Cl. ............................... 331/2; 331/11; 331/17; 331/1 A; 327/156; 327/159; 455/260; 375/376
(58) Field of Search ................................. 331/2, 11, 17, 331/1 A, 10, 74; 327/156, 159; 455/260; 375/376

(56) References Cited

U.S. PATENT DOCUMENTS 5,144,254 A * 9/1992 Wilke ........................ 327/107

OTHER PUBLICATIONS

Barrett, C.; "Fractional/Integer–N PLL Basics"; Texas Instruments; Wireless Communication Business Unit; Technical Brief SWRA029; Aug. 1999; pp. 1–55.

* cited by examiner

Primary Examiner—Arnold Kinkead
(74) Attorney, Agent, or Firm—Toler, Larson & Abel, LLP

(57) ABSTRACT

A PLL frequency synthesizer tunable in small step sizes that comprises: 1) a first PLL circuit comprising: i) a first feedforward frequency divider that receives an F(in) frequency and generates an F1 frequency, where F1=F(in)/P, ii) a first PLL core that receives the F1 frequency and generates an F2 frequency, where F2=(P+$\Delta$p)F1, and iii) a first feedback frequency divider that receives the F2 frequency and generates a first feedback signal having frequency F2/(P+$\Delta$p); and 2) a second PLL circuit comprising: i) a second feedforward frequency divider that receives the F2 frequency and generates an F3 frequency, where F3=F2/(N+$\Delta$n), ii) a second PLL core that receives the F3 frequency and generates an F(out) frequency, where F(out)=(N)F3, and iii) a second feedback frequency divider that receives the F(out) frequency and generates a second feedback signal having frequency F(out)/(N).

29 Claims, 2 Drawing Sheets

APPARATUS AND METHOD FOR SYNTHESIZING A FREQUENCY USING VERNIER DIVIDERS

TECHNICAL FIELD OF THE INVENTION

The present invention is generally directed to frequency synthesizers and, more particularly, to a PLL frequency synthesizer that may be finely tuned over a narrow range of frequencies.

BACKGROUND OF THE INVENTION

There have been great advancements in the speed, power, and complexity of integrated circuits, such as application specific integrated circuit (ASIC) chips, radio frequency integrated circuits (RFIC), central processing unit (CPU) chips, digital signal processor (DSP) chips and the like. These advancements have made possible the development of system-on-a-chip (SOC) devices, among other things. A SOC device integrates in one chip all (or nearly all) of the components of a complex electronic system, such as a wireless receiver (i.e., cell phone, a, television receiver, microprocessor, high-speed data transceiver, and the like).

In many integrated circuits, a phase-locked loop (PLL) frequency synthesizer generates many of the clock signals that drive the integrated circuit. Phase-locked loops (and delay-locked loops (DLLs)) are well known to those skilled in the art and have been extensively written about. The dynamic performance of the frequency synthesizer that generates clock signals depends on several parameters, including the natural frequency ($F_n$), the damping factor ($D_F$), the crossover frequency ($F_0$) and the ratio of the comparison frequency ($F_c$) to the crossover frequency. The performance of the frequency synthesizer also depends on the performance of the charge pump located in the PLL. The charge pump pulse timing jitter and pulse amplitude noise both contribute to synthesizer phase noise.

A common problem for a conventional PLL based on voltage-controlled oscillator (VCO) is the granularity with which the output frequency may be adjusted. Conventional PLLs contain a frequency divider (i.e., divide-by-N) block in the feedback loop. If the input frequency is F(in), then the output frequency is F(out)=N[F(in)]. However, N is typically an integer, so that increasing or decreasing N results in large increments or large decrements in the output frequency. A fractional N PLL may be implemented that changes in smaller increments. However, a fractional PLL requires complex circuitry and has a much slower response time.

Therefore, there is a need in the art for improved frequency synthesizers for use in generating reference frequency signals. In particular, there is a need in the art for a phase-locked loop (PLL) frequency synthesizer that can be finely tuned over a range of frequencies. More particularly, there is a need for a PLL frequency synthesizer that can be finely tuned and that has a fast response time.

SUMMARY OF THE INVENTION

To address the above-discussed deficiencies of the prior art, it is a primary object of the present invention to provide an improved phase-locked loop (PLL) frequency synthesizer capable of being tuned in small step sizes. According to a first advantageous embodiment of the present invention, the phase-locked loop (PLL) frequency synthesizer comprises: i) a first PLL circuit comprising: i) a first feedforward frequency divider capable of receiving an F(in) reference signal having an F(in) frequency and generating an F1 signal having an F1 frequency, where F1=F(in)/P, ii) a first PLL core capable of receiving the F1 signal and generating an F2 signal having an F2 frequency, where F2=(P+Δp)F1, and iii) a first feedback frequency divider capable of receiving the F2 signal and generating a first feedback signal having a frequency F2/(P+Δp); and ii) a second PLL circuit comprising: i) a second feedforward frequency divider capable of receiving the F2 signal and generating an F3 signal having an F3 frequency, where F3=F2/(N+Δn), ii) a second PLL core capable of receiving the F3 signal and generating an F(out) signal having an F(out) frequency, where F(out)=(N) F3, and iii) a second feedback frequency divider capable of receiving the F(out) signal and generating a second feedback signal having a frequency F(out)/(N).

According to a second advantageous embodiment of the present invention, the phase-locked loop (PLL) frequency synthesizer comprises: i) a first PLL circuit comprising: i) a first feedforward frequency divider capable of receiving an F(in) reference signal having an F(in) frequency and generating an F1 signal having an F1 frequency, where F1=F(in)/(P+Δp), ii) a first PLL core capable of receiving the F1 signal and generating an F2 signal having an F2 frequency, where F2=(P)F1, and iii) a first feedback frequency divider capable of receiving the F2 signal and generating a first feedback signal having a frequency F2/(P); and ii) a second PLL circuit comprising: i) a second feedforward frequency divider capable of receiving the F2 signal and generating an F3 signal having an F3 frequency, where F3=F2/(N), ii) a second PLL core capable of receiving the F3 signal and generating an F(out) signal having an F(out) frequency, where F(out)=(N+Δn)F3, and iii) a second feedback frequency divider capable of receiving the F(out) signal and generating a second feedback signal having a frequency F(out)/(N+Δn).

In a PLL frequency synthesizer according to the principles of the present invention the feedforward and feedback divisor values in the first and second PLL circuits are spaced apart by a minimum amount and are modified in unison to maintain the minimum spacing. The minimum amounts, Δp and Δn, may be integers (1, 2, 3) or may be fractional amounts.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
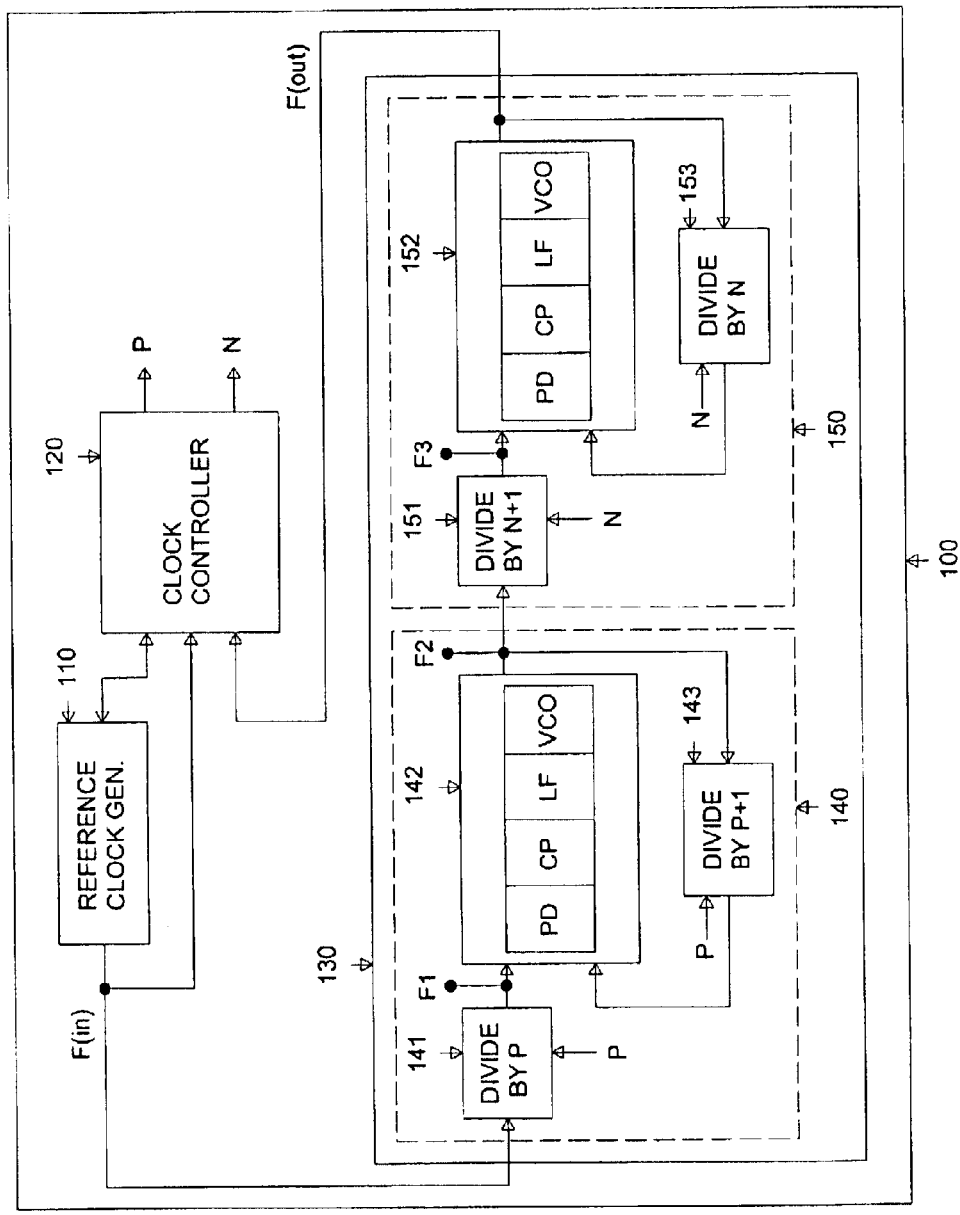
FIG. 1 illustrates a processing system comprising a phase-locked loop (PLL) frequency synthesizer according to an exemplary embodiment of the present invention.
Figure 2:
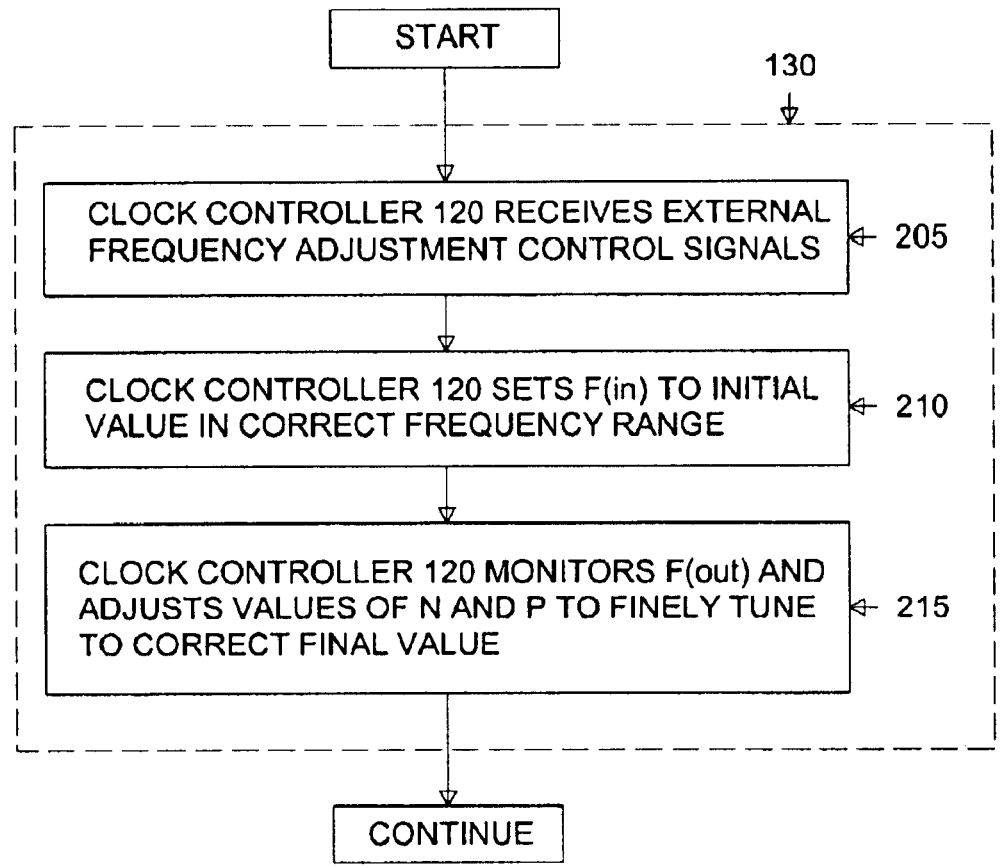
FIG. 2 is a flow diagram illustrating the operation of the exemplary PLL frequency synthesizer according to one embodiment of the present invention.

FIGS. 1 and 2, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged phase-locked loop (PLL) based frequency generator.

FIG. 1 illustrates processing system 100, which comprises a phase-locked loop (PLL) frequency synthesizer according to an exemplary embodiment of the present invention. Processing system 100 comprises reference clock generator 110, clock controller 120 and PLL frequency synthesizer 130. Under the control of clock controller 120, reference clock generator 110 generates a reference signal having a reference frequency, F(in). The F(in) signal is the input to PLL frequency synthesizer 130. PLL frequency synthesizer 130 generates an output signal having a frequency, F(out). As will be explained below in greater detail, the F(out) frequency is a finely tunable multiple of the F(in) frequency, as determined by the values N and P, produced by clock controller 120.

Processing system 100 is intended to represent any type of electronic device in which a finely tunable reference frequency is required. Thus, for example, processing system 100 may be a wireless communication device (e.g., cell phone), a video processing system (e.g., MPEG decoder), a wireline communication device (e.g., Ethernet card, set-top box, XDSL modem), a digital audio system or digital video system, or the like.

PLL frequency synthesizer 130 comprises phase-locked looped (PLL) circuit 140 and phase-locked loop (PLL) circuit 150. PLL circuit 140 comprises frequency divider 141 (i.e., divide-by-P block 141), phase-locked loop (PLL) core 142, and frequency divider 143 (i.e., divide-by-P+1 block 143). PLL circuit 150 comprises frequency divider 151 (i.e., divide-by-N block 151), phase-locked loop (PLL) core 152, and frequency divider 153 (i.e., divide-by-N+1 block 153).

PLL core 142 and PLL core 152 are conventional circuits that are well-known to those of ordinary skill in the art. Each of PLL core 142 and PLL core 152 comprises a Phase Detector (PD), a Charge Pump (CP), a Loop Filter (LF), and a Voltage Controlled Oscillator (VCO). Since PLL core 152 operates in the same manner as PLL core 142, it is sufficient to discuss only the operation of PLL core 142.

The Phase detector in PLL core 142 compares the difference in phase/frequency between the output of frequency divider 141 and the output of frequency divider 143. In response to the comparison, the Phase Detector generates a Charge Up signal or a Charge Down signal, depending on whether the output of frequency divider 141 is leading or lagging the output of frequency divider 143.

The Charge Pump receives the Charge Up signal and the Charge Down signal and accordingly either adds charge to, or drains charge from, a large charge capacitor in the Loop Filter. Adding charge to, or draining charge from, the capacitor increases or decreases the voltage on the charge capacitor. The voltage on the charge capacitor in the Loop Filter is the control voltage of the VCO. As the VCO control voltage increases or decreases, the frequency of the VCO output increases or decreases accordingly.

The frequency at the output of frequency divider 141 is (1/P) of the frequency at the input of frequency divider 141. Thus, F1=F(in)/P or F(in)=P(F1). In steady state, the two inputs of PLL core 142 (i.e., the outputs of frequency dividers 141 and 143) have the same frequency, F1. Also, the frequency, F1, at the output of frequency divider 143 is (1/(P+1)) of the frequency at the input of frequency divider 143. Thus, F1=F2/(P+1) or F2=F1(P+1). Substituting terms gives:

$$F2=F(in)[(P+1)/P] \qquad \text{Eqn. 1}$$

The frequency at the output of frequency divider 151 is (1/(N+1)) of the frequency at the input of frequency divider 151. Thus, F3=F2/(N+1) or F2=F3(N+1). In steady state, the two inputs of PLL core 152 (i.e., the outputs of frequency dividers 151 and 153) have the same frequency, F3. Also, the frequency, F3, at the output of frequency divider 153 is (1/N) of the frequency at the input of frequency divider 153. Thus, F3=F(out)/N or F(out)=F3(N). Substituting terms gives:

$$F(out)=F2[N/(N+1)] \qquad \text{Eqn. 2}$$

Substituting Equation 1 into Equation 2 gives:

$$F(out)=F(in)[N/(N+1)][(P+1)/P] \qquad \text{Eqn. 3}$$

Advantageously, PLL frequency synthesizer 130 allows the output frequency to be adjusted in step sizes that are much smaller than the frequencies of the reference inputs to each Phase Detector. This eliminates the need for a large Loop Filter capacitor with a long time constant and reduces lock time.

By way of example, assume that F(in) is 1000 Hz, P is 10, and N is 9, 10, or 11. Table 1 below lists the corresponding frequencies in PLL frequency synthesizer 130.

TABLE 1

| N | F(in) | F1 | F2 | F3 | F(out) |
|---|---|---|---|---|---|
| 9 | 1000 | 100 | 1100 | 110 | 990 |
| 10 | 1000 | 100 | 1100 | 100 | 1000 |
| 11 | 1000 | 100 | 1100 | 91.67 | 1008.3 |

The step sizes are approximately 0.009 of the input frequency F(in). This is much better (i.e., smaller) than the approximately 0.1[F(in)] step size (average) that would be achieved by a typical prior art PLL using only a feedback frequency divider with N=10. Thus, clock controller 120 may adjust the values of N and P together to finely tune the output frequency F(out). As N and P get larger (e.g., 50, 51), the step sizes become much smaller. In an alternate embodiment of the present invention, PLL circuit 140 may be omitted and a reference signal having a reference frequency F2 may be applied directly to frequency divider 151.

FIG. 2 depicts flow diagram 200, which illustrates the operation of PLL frequency synthesizer 103 according to an exemplary embodiment of the present invention. During routine operation, clock controller 120 may from time to time receive external frequency adjustment control signals (process step 205). These control signals may be received from an external device, may be generated by other portions of processing system 100, or may be generated in response to inputs from an operator of processing system 100. Clock controller 120 then sets the F(in) reference frequency to an initial value in the correct frequency range (process step 210). Thereafter, clock controller 120 monitors the frequency of the F(out) signal and periodically adjusts the values of N and P to finely tune to the correct final value of the F(out) frequency (process step 215).

In the embodiment shown in FIG. 1, the feedforward divider (i.e., frequency divider 141) of the first PLL divides by P and the feedback divider (i.e., frequency divider 143) divides by P+1. This results in a step up in frequency from F(in) to F2. However, in the second PLL, the feedforward divider (i.e., frequency divider 151) divides by N+1 and the feedback divider (i.e., frequency divider 153) divides by N. This results in a step down in frequency from F2 to F(out), where F(out) differs from F(in) by only a small incremental amount (or F(out) may equal F(in) if P and N are equal).

However, it should be understood that this is for illustration only and should not be construed to limit the scope of the present invention. In another embodiment of the present invention, PLL frequency synthesizer 130 may be modified so the first PLL steps down the frequency from F(in) to F2 and the second PLL steps up the frequency from F2 to F(out). This is accomplished by modifying PLL frequency synthesizer 130 such that frequency divider 141 divides by P+1, frequency divider 143 divides by P, frequency divider 151 divides by N, and frequency divider 153 divides by N+1.

The key aspects of PLL frequency synthesizer 130 are that the feedforward and feedback divisor values in each PLL differ by a minimum amount and are modified in unison to maintain the minimum spacing. The minimum amount does not have to be 1, but may be other integers or even a fractional amount. Thus, generally speaking, the divisor values of the feedforward and feedback frequency dividers are P and P+Δp in one PLL and N and N+Δn in the other PLL, where Δn and Δp are the minimum possible integer values or the minimum possible fractional values.

Although the present invention has been described with an exemplary embodiment, various changes and modifications may be suggested to one skilled in the art. It is intended that the present invention encompass such changes and modifications as fall within the scope of the appended claims.

What is claimed is:

1. A phase-locked loop (PLL) frequency synthesizer comprising:

a first PLL circuit comprising: i) a first feedforward frequency divider capable of receiving an F(in) reference signal having an F(in) frequency and generating an F1 signal having an F1 frequency, where F1–F(in)/P, ii) a first PLL core capable of receiving said F1 signal and generating an F2 signal having an F2 frequency, where F2=(P+1)F1, and iii) a first feedback frequency divider capable of receiving said F2 signal and generating a first feedback signal having a frequency F2/(P+1);

a second PLL circuit comprising: i) a second feedforward frequency divider capable of receiving said F2 signal and generating an F3 signal having an F3 frequency, where F3=F2/(N+1), ii) a second PLL core capable of receiving said F3 signal and generating an F(out) signal having an F(out) frequency, where F(out)=(N)F3, and iii) a second feedback frequency divider capable of receiving said F(out) signal and is generating a second feedback signal having a frequency F(out)/(N); and a clock controller capable of monitoring said F(out) signal and further capable of tuning said F(out) frequency by modifying at least one of N or P.

2. The phase-locked loop (PLL) frequency synthesizer as set forth in claim 1 wherein N and P are modifiable integer values.

3. The phase-locked loop (PLL) frequency synthesizer as set forth in claim 1 wherein said first PLL core comprises a first phase detector and a first voltage controlled oscillator (VCO), wherein said first phase detector receives and compares said F1 signal and said first feedback signal and wherein said first VCO generates said F2 signal.

4. The phase-locked loop (PLL) frequency synthesizer as set forth in claim 1 wherein said second PLL core comprises a second phase detector and a second voltage controlled oscillator (VCO), wherein said second phase detector receives and compares said F3 signal and said second feedback signal and wherein said second VCO generates said F(out) signal.

5. A phase-locked loop (PLL) frequency synthesizer comprising:

a first PLL circuit comprising: i) a first feedforward frequency divider capable of receiving an F(in) reference signal having an F(in) frequency and generating an F1 signal having an F1 frequency, where F1=F(in)/(P+1), ii) a first PLL core capable of receiving said F1 signal and generating an F2 signal having an F2 frequency, where F2=(P)F1, and iii) a first feedback frequency divider capable of receiving said F2 signal and generating a first feedback signal having a frequency F2/(P);

a second PLL circuit comprising: i) a second feedforward frequency divider capable of receiving said F2 signal and generating an F3 signal having an F3 frequency r–where F3=F2/(N), ii) a second PLL core capable of receiving said F3 signal and generating an F(out) signal having an F(out) frequency, where F(out)=(N+1)F3, and iii) a second feedback frequency divider capable of receiving said F(out) signal and generating a second feedback signal having a frequency F(out)/(N+1); and a clock controller capable of monitoring said F(out) signal and further capable of tuning said F(out) frequency by modifying at least one of N or P.

6. The phase-locked loop (PLL) frequency synthesizer as set forth in claim 5 wherein N and P are modifiable integer values.

7. The phase-locked loop (PLL) frequency synthesizer as set forth in claim 5 wherein said first PLL core comprises a first phase detector and a first voltage controlled oscillator (VCO), wherein said first phase detector receives and compares said F1 signal and said first feedback signal and wherein said first VCO generates said F2 signal.

8. The phase-locked loop (PLL) frequency synthesizer as set forth in claim 5 wherein said second PLL core comprises a second phase detector and a second voltage controlled oscillator (VCO), wherein said second phase detector receives and compares said F3 signal and said second feedback signal and wherein said second VCO generates said F(out) signal.

9. A phase-locked loop (PLL) frequency synthesizer comprising:
a first PLL circuit comprising: i) a first feedforward frequency divider capable of receiving an F(in) reference signal having an F(in) frequency and generating an F1 signal having an F1 frequency, where F1=F(in)/P, ii) a first PLL core capable of receiving said F1 signal and generating an F2 signal having an F2 frequency, where F2=(P+$\Delta$p)F1, and iii) a first feedback frequency divider capable of receiving said F2 signal and generating a first feedback signal having a frequency F2/(P+$\Delta$p);
a second PLL circuit comprising: i) a second feedforward frequency divider capable of receiving said F2 signal and generating an F3 signal having an F3 frequency, where F3=F2/(N+$\Delta$n), ii) a second PLL core capable of receiving said F3 signal and generating an F(out) signal having an F(out) frequency, where F(out)=(N) F3, and iii) a second feedback frequency divider capable of receiving said F(out) signal and generating a second feedback signal having a frequency F(out)/(N); and
a clock controller capable of monitoring said F(out) signal and further capable of tuning said F(out) frequency by modifying at least one of N or P.

10. The phase-locked loop (PLL) frequency synthesizer as set forth in claim 9 wherein N and P are modifiable integer or fractional values.

11. The phase-locked loop (PLL) frequency synthesizer as set forth in claim 10 wherein $\Delta$p is a minimum increment by which P may be modified and $\Delta$n is a minimum increment by which N may be modified.

12. The phase-locked loop (PLL) frequency synthesizer as set forth in claim 9 wherein-said first PLL core comprises a first phase detector and a first voltage controlled oscillator (VCO), wherein said first phase detector receives and compares said F1 signal and said first feedback signal and wherein said first VCO generates said F2 signal.

13. The phase-locked loop (PLL) frequency synthesizer as set forth in claim 9 wherein said second PLL core comprises a second phase detector and a second voltage controlled oscillator (VCO), wherein said second phase detector receives and compares said F3 signal and said second feedback signal and wherein said second VCO generates said F(out) signal.

14. A phase-locked loop (PLL) frequency synthesizer comprising:
a first PLL circuit comprising: i) a first feedforward frequency divider capable of receiving an F(in) reference signal having an F(in) frequency and generating an F1 signal having an F1 frequency, where F1=F(in)/(P+$\Delta$p), ii) a first PLL core capable of receiving said F1 signal and generating an F2 signal having an F2 frequency, where F2=(P)F1, and iii) a first feedback frequency divider capable of receiving said F2 signal and generating a first feedback signal having a frequency F2/(P);
a second PLL circuit comprising: i) a second feedforward frequency divider capable of receiving said F2 signal and generating an F3 signal having an F3 frequency, where F3=F2(N), ii) a second PLL core capable of receiving said F3 signal and generating an F(out) signal having an F(out) frequency, where F(out)=(N+$\Delta$n)F3, and iii) a second feedback frequency divider capable of receiving said F(out) signal and generating a second feedback signal having a frequency F(out)/(N+$\Delta$n); and
a clock controller capable of monitoring said F(out) signal and further capable of tuning said F(out) frequency by modifying at least one of N or P.

15. The phase-locked loop (PLL) frequency synthesizer as set forth in claim 14 wherein N and P are modifiable integer or fractional values.

16. The phase-locked loop (PLL) frequency synthesizer as set forth in claim 15 wherein $\Delta$p is a minimum increment by which P may be modified and $\Delta$n is a minimum increment by which N may be modified.

17. The phase-locked loop (PLL) frequency synthesizer as set forth in claim 14 wherein said first PLL core comprises a first phase detector and a first voltage controlled oscillator (VCO), wherein said first phase detector receives and compares said F1 signal and said first feedback signal and wherein said first VCO generates said F2 signal.

18. The phase-locked loop (PLL) frequency synthesizer as set forth in claim 14 wherein said second PLL core comprises a second phase detector and a second voltage controlled oscillator (VCO), wherein said second phase detector receives and compares said F3 signal and said second feedback signal and wherein said second VCO generates said F(out) signal.

19. A processing system comprising:
a reference clock generator capable of generating an F(in) reference signal having an F(in) frequency;
a phase-locked loop (PLL) frequency synthesizer capable of being tuned in small step sizes, said PLL frequency synthesizer comprising:
a first PLL circuit comprising: i) a first feedforward frequency divider capable of receiving said F(in) reference signal and generating an F1 signal having an F1 frequency, where F1=F(in)/P, ii) a first PLL core capable of receiving said F1 signal and generating an F2 signal having an F2 frequency, where F2=(P+$\Delta$p)F1, and iii) a first feedback frequency divider capable of receiving said F2 signal and generating a first feedback signal having a frequency F2/(P+$\Delta$p); and
a second PLL circuit comprising: i) a second feedforward frequency divider capable of receiving said F2 signal and generating an F3 signal having an F3 frequency, where F3–F2/(N+$\Delta$n), ii) a second PLL core capable of receiving said F3 signal and generating an F(out) signal having an F(out) frequency, where F(out)=(N)F3, and iii) a second feedback frequency divider capable of receiving said F(out) signal and generating a second feedback signal having a frequency F(out)/(N); and
a clock controller capable of controlling said reference clock generator and monitoring said F(out) signal, wherein said clock controller is capable of tuning said F(out) frequency by modifying at least one of N or P, wherein N and P are integer or fractional values.

20. The processing system as set forth in claim 19 wherein $\Delta p$ is a minimum increment by which P may be modified and $\Delta n$ is a minimum increment by which N may be modified.

21. A processing system comprising:
a reference clock generator capable of generating an F(in) reference signal having an F(in) frequency;
a phase-locked loop (PLL) frequency synthesizer capable of being tuned in small step sizes, said PLL frequency synthesizer comprising:
a first PLL circuit comprising: i) a first feedforward frequency divider capable of receiving said F(in) reference signal and generating an F1 signal having an F1 frequency, where $F1=F(in)/(P+\Delta p)$, ii) a first PLL core capable of receiving said F1 signal and generating an F2 signal having an F2 frequency, where $F2=(P)F1$, and iii) a first feedback frequency divider capable of receiving said F2 signal and generating a first feedback signal having a frequency $F2/(P)$; and
a second PLL circuit comprising: i) a second feedforward frequency divider capable of receiving said F2 signal and generating an F3 signal having an F3 frequency, where $F3=F2/(N)$, ii) a second PLL core capable of receiving said F3 signal and generating an F(out) signal having an F(out) frequency, where $F(out)=(N+\Delta n)F3$, and iii) a second feedback frequency divider capable of receiving said F(out) signal and generating a second feedback signal having a frequency $F(out)/(N+\Delta n)$; and
a clock controller capable of controlling said reference clock generator and monitoring said F(out) signal, wherein said clock controller is capable of tuning said F(out) frequency by modifying at least one of N or P, wherein N and P are integer or fractional values.

22. The processing system as set forth in claim 21 wherein $\Delta p$ is a minimum increment by which P may be modified and $\Delta n$ is a minimum increment by which N may be modified.

23. A phase-locked loop (PLL) frequency synthesizer comprising:
a first PLL circuit to:
receive a first signal having a first frequency F1; and
generate a second signal having a second frequency F2 based at least in part on the first signal, where the second frequency F2 is substantially equivalent to $F1(P+1)/P$, where P is a real number;
a second PLL circuit to:
receive said second signal; and
generate a third signal having an third frequency F3 based at least in part on the second signal, where the third frequency F3 is substantially equivalent to $F2(N)/(N+1)$, where N is a real number; and
a clock controller capable of monitoring said third signal and further capable of tuning said third frequency by modifying at least one of N or P.

24. The phased-locked loop (PLL) frequency synthesizer as set forth in claim 23, wherein the second signal is further based at least in part on a first feedback signal having a first feedback frequency substantially equivalent to $F2/(P+1)$.

25. The phased-locked loop (PLL) frequency synthesizer as set forth in claim 24, wherein the third signal is further based at least in part on a second feedback signal having a second feedback frequency substantially equivalent to $F3/N$.

26. A phase-locked loop (PLL) frequency synthesizer comprising:
a first PLL circuit to:
receive a first signal having a first frequency F1; and
generate a second signal having a second frequency F2 based at least in part on the first signal, where the second frequency F2 is substantially equivalent to $F1(P)/(P+\Delta p)$, where P and $\Delta p$ are real numbers;
a second PLL circuit to:
receive said second signal; and
generate a third signal having an third frequency F3 based at least in part on the second signal, where the third frequency F3 is substantially equivalent to $F2(N+\Delta n)/(N)$, where N and $\Delta n$ are real numbers; and
a clock controller capable of monitoring said third signal and further capable of tuning said third frequency by modifying at least one of N or P.

27. The phased-locked loop (PLL) frequency synthesizer as set forth in claim 26, wherein the second signal is further based at least in part on a first feedback signal having a first feedback frequency substantially equivalent to $F2/P$.

28. The phased-locked loop (PLL) frequency synthesizer as set forth in claim 27, wherein the third signal is further based at least in part on a second feedback signal having a second feedback frequency substantially equivalent to $F3/(N+\Delta n)$.

29. The phased-locked loop (PLL) frequency synthesizer as set forth in claim 26 wherein $\Delta p$ is a minimum increment by which P may be modified and $\Delta n$ is a minimum increment by which N may be modified.

* * * * *

UNITED STATES PATENT AND TRADEMARK OFFICE
CERTIFICATE OF CORRECTION

PATENT NO. : 6,833,764 B1
DATED : December 21, 2004
INVENTOR(S) : Gregory L. Dean It is certified that error appears in the above-identified patent and that said Letters Patent is hereby corrected as shown below:

Column 8,
Line 59, change "F3-F2/(N+$\Delta$n)," to read -- F3=F2/(N+$\Delta$n), --

Column 9,
Line 29, change "F(out)-(N+$\Delta$n)F3," to read -- F(out)=(N+$\Delta$n)F3, --

Signed and Sealed this

Seventh Day of June, 2005

JON W. DUDAS
*Director of the United States Patent and Trademark Office*